United States Patent [19]

Ohkubo

[11] Patent Number: 4,492,922

[45] Date of Patent: Jan. 8, 1985

[54] MAGNETIC SENSOR WITH TWO SERIES-CONNECTED MAGNETORESISTIVE ELEMENTS AND A BIAS MAGNET FOR SENSING THE PROXIMITY OF A RELATIVELY MOVABLE MAGNETICALLY PERMEABLE MEMBER

[75] Inventor: Hiroyuki Ohkubo, Chiba, Japan

[73] Assignee: Sony Corporation, Tokyo, Japan

[21] Appl. No.: 328,613

[22] Filed: Dec. 8, 1981

[30] Foreign Application Priority Data

Dec. 9, 1980 [JP] Japan ................................ 55-172553
Dec. 9, 1980 [JP] Japan ................................ 55-172554

[51] Int. Cl.[3] ........................ G01B 7/14; G01R 33/02
[52] U.S. Cl. .................................. 324/207; 338/32 R
[58] Field of Search ............... 324/207, 208, 235, 252; 338/32 R

[56] References Cited

U.S. PATENT DOCUMENTS 4,039,936 8/1977 Jones et al. ......................... 324/208
4,053,829 10/1977 Maruo ................................. 324/260
4,361,805 11/1982 Narimatsu ........................... 324/207
4,429,276 1/1984 Narimatsu et al. ................. 324/207

*Primary Examiner*—Gerard R. Strecker
*Assistant Examiner*—Walter E. Snow
*Attorney, Agent, or Firm*—Lewis H. Eslinger; Alvin Sinderbrand

[57] ABSTRACT

A magnetic sensor for sensing the proximity of a magnetically permeable member, the sensor and member being relatively movable with respect to each other and having an axis of movement disposed within a fixed plane. The magnetic sensor includes two coplanar magnetoresistive elements, each element having a main current conducting path and possessing anisotropic resistance as a function of the direction of a resultant magnetic field applied thereto. The two magnetoresistive elements are connected in series, and a d.c. current is supplied to the series-connected elements. First and second saturating bias magnetic fields are supplied, as by a bias magnet, to respective ones of the magnetoresistive elements at the same angle $\theta_o$ to each of the respective main current conducting paths in the absence of the magnetically permeable member. The angle at which each bias field is supplied is changed by substantially equal and opposite small deviation angles $\pm\Delta\theta$ in response to the relative movement of the permeable member proximate the magnetic sensor. An output circuit is coupled to the junction defined by the series-connected magnetoresistive elements to produce an output signal which varies as a function of the deviation angles by which the angles of the bias fields change.

12 Claims, 9 Drawing Figures

30
23
21
θo
+Δθ
HB
IB
25
22
θo
-Δθ
HB
IB
26
Vo
28
24
20

MAGNETIC SENSOR WITH TWO SERIES-CONNECTED MAGNETORESISTIVE ELEMENTS AND A BIAS MAGNET FOR SENSING THE PROXIMITY OF A RELATIVELY MOVABLE MAGNETICALLY PERMEABLE MEMBER

BACKGROUND OF THE INVENTION

This invention relates to a magnetic sensor and, more particularly, to a magnetoresistive-type magnetic sensor which is readily adapted to sense the proximity of a magnetically permeable member.

Magnetic sensors are useful in instrumentation, magnetic readers, position detectors, and various other applications. Typically, the magnetic sensor is used as a so-called "contactless" switch wherein an output signal is generated, analogous to the closing or opening of a switch, when a particular magnetic event is sensed. Such a contactless switch often is used in servo control systems wherein a process or machine is controlled as a function of the output of the contactless switch.

A semiconductive magnetic reluctance element, such as a Hall effect device, has been proposed for use as a magnetic sensor. The Hall effect device, being a semiconductive transducer, exhibits undesirable temperature characteristics. Accordingly, when a Hall effect device is used, a temperature compensating circuit generally must be employed. Furthermore, correction and compensating circuitry also is provided, thus increasing the complexity and cost of a magnetic sensor using a Hall effect device.

Another magnetic sensor that has been proposed relies upon the ferromagnetic reluctance effect of a ferromagnetic metal. In one application of this ferromagnetic reluctance effect, the resistance of the ferromagnetic material changes in response to a relatively large external magnetic field in accordance with Mott's theory. In general, as the external magnetic field increases, the resistance of the ferromagnetic material decreases. This negative relationship between the magnetic field and the resistance of the ferromagnetic material typically is linear. An isotropic relationship with respect to the direction of the magnetic field obtains when the ferromagnetic material is heated to its Curie temperature. At lower temperatures, however, this isotropic relationship is minimal. Since the negative magnetic reluctance effect is useful only in the environment of relatively high magnetic fields, magnetic sensors which rely upon this effect exhibit limited utility in specialized applications.

In the presence of relatively small magnetic fields, some ferromagnetic materials exhibit a resistivity that varies anisotropically with the direction of the applied magnetic field. Magnetic sensors employing this ferromagnetic material have been formed of an insulating substrate with a thin film of ferromagnetic material deposited thereon to form ferromagnetic strips in zigzag or serpentine configuration. Such ferromagnetic strips exhibit magnetoresistance, whereby the resistance of the strips varies anisotropically. The use of such magnetoresistive elements to detect a magnetic field is disclosed in U.S. Pat. Nos. 3,928,836, 4,021,728, 4,053,829 and 4,079,360, as well as in application Ser. Nos. 23,270, filed Mar. 23, 1979, and Ser. No. 237,115, filed Feb. 23, 1981, all assigned to the assignee of the present invention.

In the foregoing patents and patent applications, the magnetic sensor generally is comprised of two series-connected magnetoresistive elements having respective main current conducting paths which, typically, are perpendicular to each other. If a saturating bias magnetic field is supplied to both magnetoresistive elements, a predetermined output signal is produced. If the direction of the saturating magnetic field changes, the output signal will change as a function of the angle formed between the direction of the magnetic field and the main current conducting paths of the magnetoresistive elements.

In the magnetic sensors of the aforementioned type, wherein magnetoresistive elements are used, a maximum resistivity is exhibited by the magnetoresistive element when the direction of the applied magnetic field is parallel to the main current conducting path thereof. This resistivity is, however, a minimum when the applied magnetic field is perpendicular to the current conducting path. This anisotropic relationship is expressed in the Voight-Thomson equation:

$$R(\theta)=R_{195}\cdot\sin^2\theta+R_{\parallel}\cdot\cos^2\theta \quad (1)$$

In equation (1) above, $\theta$ represents the angle of the magnetic field relative to the current conducting path. That is, the angle of the magnetic field relative to the longitudinal direction of the magnetoresistive strip which is included in the magnetoresistive element. Also, in equation (1) above, $R_{\perp}$ represents the resistance of the magnetoresistive element when the magnetic field is applied in a direction perpendicular to the direction of current flowing therethrough; and $R_{\parallel}$ represents the resistance of the magnetoresistive element when the magnetic field is parallel to the direction in which the current flows therethrough.

Some examples of ferromagnetic metals which exhibit desirable magnetoresistive characteristics and which can be used in the aforedescribed magnetic sensors are nickel-cobalt (NiCo) alloy, nickel-iron (NiFe) alloy, nickel-aluminum (NiAl) alloy, nickel-manganese (NiMn) alloy and nickel-zinc (NiZn) alloy.

In magnetic sensors of the aforementioned type, a saturating bias field is applied to two coplanar series-connected magnetoresistive elements, and an external, movable flux source, such as a magnet, is moved with respect to the magnetic sensor. The flux, or external field, generated by the magnet combines vectorially with the bias field such that the resultant field sensed by the magnetic sensor exhibits a particular angle; and this angle is detected by its action upon the magnetoresistance of the elements (as set out in equation (1) above). As a result, the magnetic sensor produces an output signal which is a function of that angle and, thus, a function of the relative location of the external magnet. In U.S. Pat. No. 4,021,728, the direction of the bias field relative to the magnetoresistive elements is disturbed by the influence thereon of a movable, highly permeable member.

Unfortunately, in many magnetic sensors formed of magnetoresistive elements, the output signal produced as a function of the angle of the magnetic field therethrough varies significantly with changes in temperature. Furthermore, in such magnetic sensors, the bias field generally is supplied at an angle which is less than optimum. That is, relatively large changes in the angle of the resultant field through the magnetoresistive elements causes only correspondingly small changes in the output signal produced thereby. That is, the rate of change of the output signal with respect to the angle of the resultant field is relatively low. Hence, such magnetic sensors do not exhibit relatively high sensitivity and low temperature-dependency, as are desired.

OBJECTS OF THE INVENTION

Therefore, it is an object of the present invention to provide an improved magnetic sensor which overcomes the aforenoted disadvantages.

Another object of this invention is to provide an improved magnetic sensor which is readily adapted to sense the proximity of a relatively movable magnetically permeable member.

A further object of this invention is to provide a magnetic sensor formed of magnetoresistive elements, which sensor exhibits relatively stable temperature characteristics and, moreover, is more sensitive to changes in the direction of the magnetic field therethrough than are prior art sensors.

Yet another object of this invention is to provide an improved magnetic sensor, formed of magnetoresistive elements, which produces a relatively large output signal in response to relatively small changes in proximity of a magnetically permeable member which is detected thereby.

Various other objects, advantages and features of the present invention will become readily apparent from the ensuing detailed description, and the novel features will be particularly pointed out in the appended claims.

SUMMARY OF THE INVENTION

In accordance with this invention, a magnetic sensor is provided for sensing the proximity of a magnetically permeable member, wherein the sensor and member are relatively movable with respect to each other and have an axis of movement that is disposed within a fixed plane. The sensor is comprised of two coplanar magnetoresistive elements, each element having a main current conducting path and possessing anisotropic resistance as a function of the direction of a resultant magnetic field applied thereto. The magnetoresistive elements are connected in series with each other and a d. c. current is supplied thereto. First and second saturating bias magnetic fields are supplied, as by a bias magnet to respective ones of the magnetoresistive elements at the same angle $\theta_o$ to each of the main current conducting paths in the absence of the magnetically permeable member. The angle at which each bias field is supplied is changed by substantially equal and opposite small deviation angles $\pm\Delta\theta$ in response to the relative movement of the permeable member proximate the magnetic sensor. An output circuit is coupled to the junction defined by the series-connected elements to produce an output signal which varies as a function of the deviation angles by which the angles of the bias fields change.

In accordance with a preferred embodiment, the angle $\theta_o$ at which the bias fields are supplied to the respective magnetoresistive elements is equal to 45° ($\theta_o=45°$).

In accordance with another embodiment, the angles at which the bias fields are supplied to the respective magnetoresistive elements are not identical to each other. Rather, the bias field supplied to one element exhibits an angle $\theta_o+\Delta\theta_C$ to the main current conducting path therein, and the bias field supplied to the other magnetoresistive element exhibits the angle $\theta_o-\Delta\theta_C$ relative to the main current conducting path therein, wherein $\Delta\theta_C$ is a relatively small angle with respect to the angle $\theta_o$. In this embodiment, the angle of the respective bias fields relative to the main current conducting paths change by $\pm\Delta\theta$ in response to the relative movement of the magnetically permeable member.

Advantageously, and in accordance with this invention, the output voltage $\Delta V$ derived from the magnetic sensor varies as a function of the aforementioned deviation angles $\Delta\theta$ in accordance with the equation: $\Delta V=K_1 V_o \sin 2\Delta\theta$, wherein $K_1$ is a constant and $V_o$ is the voltage produced across the magnetoresistive elements by the d. c. current supply.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
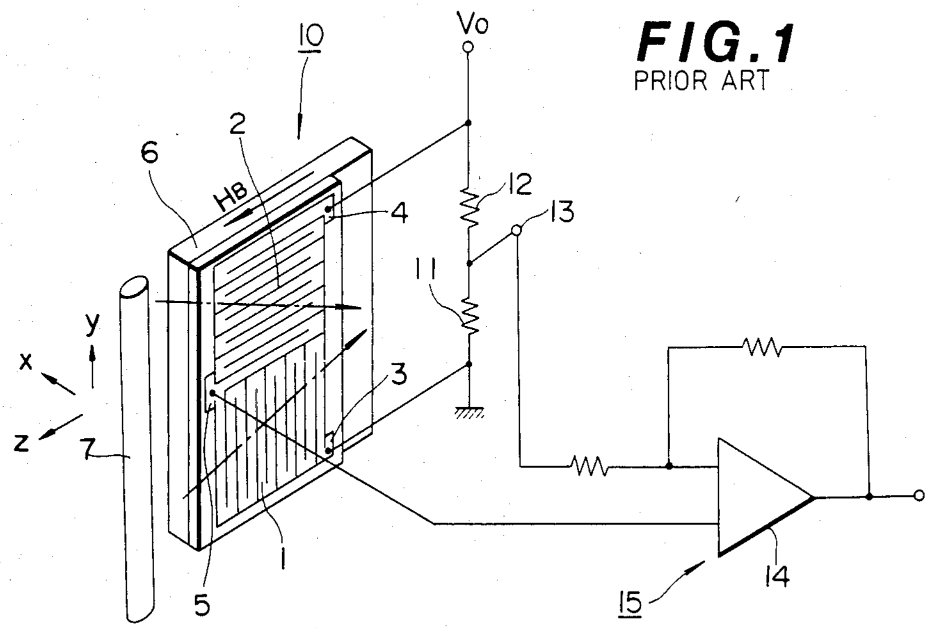
FIG. 1 is a schematic diagram of a typical embodiment of a magnetic sensor which admits of substantially the same construction as that of the present invention, but which does not exhibit the improved results attained hereby.

Referring now to the drawings, FIG. 1 is a schematic representation of a magnetic sensor 10 formed of magneto-resistive elements, and adapted to detect the relative proximity of a magnetically permeable member 7 which is relatively movable with respect to the magnetic sensor. This magnetic sensor is comprised of an insulating substrate upon which a thin film of ferromagnetic material is deposited to form magnetoresistive elements 1 and 2 which appear as strips in zig-zag or serpentine configuration. These strips are current conductors and, as shown in FIG. 1, the main current conducting paths of magnetoresistive element 1 are disposed substantially perpendicular to the main current conducting paths of magnetoresistive element 2. Terminals 3, 4 and 5 also are formed, with terminals 3 and 4 serving to supply a d. c. current through the magnetoresistive elements 1, 2, and terminal 5 being formed as the junction defined by the series-connected magnetoresistive elements. As viewed in FIG. 1, the main current conducting path of magnetoresistive element 1 is capable of conducting current predominantly in the vertical direction, and the main current conducting path of magnetoresistive element 2 is capable of conducting current predominantly in the horizontal direction.

The magnetic sensor formed of series-connected magnetoresistive elements 1 and 2 is mounted on a bias magnet 6 which generates a bias field H sufficient to saturate the elements. In the absence of any further external magnetic field, such as an external magnet, and in the absence of any external magnetically permeable member, such as member 7, the bias field generated by bias magnet 6 is parallel to the main current conducting paths of magnetoresistive element 2 and, thus, perpendicular to the main current conducting paths of magnetoresistive element 1. However, if magnetically permeable member 7 is disposed within the vicinity of magnetic sensor 10, the field from bias magnet 6 will pass through member 7 and will significantly influence the net direction of the magnetic field which passes through magnetoresistive elements 1 and 2. This phenomenon is illustrated in FIG. 1 wherein member 7, such as soft iron, is proximate magnetic sensor 10. As a result of this influence of member 7 on the bias field, the resultant bias field $H_B$ passes through magnetoresistive elements 1 and 2 in the illustrated directions.

In FIG. 1, it is appreciated that magnetoresistive elements 1 and 2 are coplanar, that is, they are disposed in substantially the same plane, and the bias field H generated by bias magnet 6 is substantially parallel to this plane. The bias field $H_B$ which passes through magnetoresistive element 1 undergoes a positive deviation angle $\pm\Delta\theta$ on the order of about 15°, when the permeable member 7 is disposed in the illustrated position. Similarly, the bias field $H_B$ which passes through magnetoresistive element 2 undergoes a deviation angle $-\Delta\theta$ on the order of about 15° in response to the presence of member 7. It will be understood that the actual deviation angle $\Delta\theta$, that is, the actual angular rotation of the bias field $H_B$ through magnetoresistive elements 1 and 2, is dependent upon the proximity of member 7 to magnetic sensor 10. This deviation angle $\Delta\theta$ is substantially equal to zero when member 7 is relatively far from the magnetic sensor 10. That is, the deviation angle $\Delta\theta$ is equal to zero when the member 7 is so far away as to be considered to be "absent". However, as the member 7 moves closer to the magnetic sensor, or as the magnetic sensor moves closer to the permeable member, the bias fields through the magnetoresistive elements are disturbed by the influence of the magnetically permeable member, thereby undergoing a deviation angle $\Delta\theta$.

Since either the permeable member or the magnetic sensor is movable, motion of either the member or the sensor is referred to herein as relative motion. It will be understood that this relative motion may occur in any of the illustrated x, y and z directions. It will be assumed, for purposes of the present discussion, that permeable member 7 is fixed in the y and z directions, and is movable only in the x direction. Alternatively, it may be recognized that, if magnetic sensor 10 is movable, the magnetic sensor is movable only in the x direction. This is referred to herein as meaning that the relative movement between the permeable member and the magnetic sensor has an axis of movement disposed within a fixed plane, this plane containing the dimension x. Thus, and with reference to FIG. 1 as being merely illustrative, member 7 and magnetic sensor 10 may be thought of as being relatively movable only in the horizontal direction, and not in the vertical direction or in the direction which is perpendicular to the plane of the drawing.

Magnetic sensor 10 is connected in a bridge arrangement, as will now be described. A suitable source of operating potential $V_o$ is coupled across d. c. current supply terminals 3 and 4 of the magnetic sensor, so as to supply d. c. current thereto. Series-connected resistors 11 and 12 are coupled in parallel with series-connected magnetoresistive elements 1 and 2, as illustrated. A difference amplifier 15, formed of an operational amplifier 14 having a particular gain determined by the illustrated resistors, includes a pair of inputs coupled to terminals 5 and 13, respectively, the latter being coupled to the junction defined by resistors 11 and 12. The output of operational amplifier 14 constitutes the output of the difference amplifier and, as will be described, provides a signal which varies as a function of the deviation angle $\Delta\theta$ of the bias field $H_B$. That is, the output signal produced by difference amplifier 15 varies as a function of the proximity of permeable member 7 to magnetic sensor 10.

It is appreciated that the legs of the illustrated bridge arrangement are formed of resistors 11 and 12, and also the effective resistance of magnetoresistive element 1 and the effective resistance of magnetoresistive element 2. As discussed above, the effective resistance of these magnetoresistive elements is a function of the angle between the main current conducting path therein and the direction at which the bias field is supplied thereto. In the embodiment shown in FIG. 1, the voltage produced at terminal 5 has a component equal to $V_o/2$ which, of course, is fixed, and a component which is a function of the resistance of magnetoresistive elements 1 and 2. Since the resistance of magnetoresistive elements 1 and 2 is determined by the deviation angle $\Delta\theta$, this second voltage component is a function of the deviation angle $\Delta\theta$. Preferably, resistors 11 and 12 function as a voltage divider to produce at terminal 13, a d. c. voltage equal to $V_o/2$. Hence, the d. c. voltage $V_o/2$, produced at terminal 5, is cancelled by the operation of difference amplifier 15, resulting in an output voltage $\Delta V$ at the output of the difference amplifier, which output voltage $\Delta V$ may be represented as:

$$\Delta V = KV_o \cos 2\Delta\theta \quad (2)$$

wherein K is a constant which is a function of the anisotropic resistances $R_\perp$, $R_\parallel$, and the gain of the difference amplifier.

In the embodiment shown in FIG. 1, the bias magnetic field H, in the absence of magnetically permeable member 7, is disposed at an angle $\theta=90°$ with respect to the main current conducting paths of magnetoresistive element 1. For the purpose of the present discussion, it is assumed that this is the angle at which the bias field is supplied to the magnetoresistive elements. It is, of course, recognized that the angle at which this bias field is supplied to magnetoresistive element 2 is $\theta=0°$ with respect to the main current conducting paths therein. Member 7 is assumed to be a magnetically permeable rod and, therefore, when the rod approaches magnetic sensor 10, the angle $\theta$ rotates by the deviation angle $\Delta\theta$ in response to the influence of the magnetically permeable material of rod 7 upon the bias field H. The maximum deviation angle $\Delta\theta$ is on the order of about $\pm 15°$ for the presently described arrangement wherein the bias field is at an initial angle $\theta=90°$. In actual operation, the gain of difference amplifier 15 is adjusted so as to set the operating point of the illustrated embodiment to about one-third of the output level. Accordingly, a rotation of the bias field by the deviation angle $\Delta\theta$ on the order of about 10° is detected and used to control further apparatus. That is, the level of the output signal produced by difference amplifier 15 in response to a 10° change in the direction of the bias field is sufficient to, for example, trigger further apparatus to operate. This level change in the output signal is analogous to the closing or opening of a switch. Hence, when permeable member 7 is in the proximity of magnetic sensor 10 so as to cause a 10° rotation in the bias field $H_B$, the illustrated apparatus operates as a contactless switch, effecting an operation analogous to the opening or closing of a conventional switch.

Figure 2:
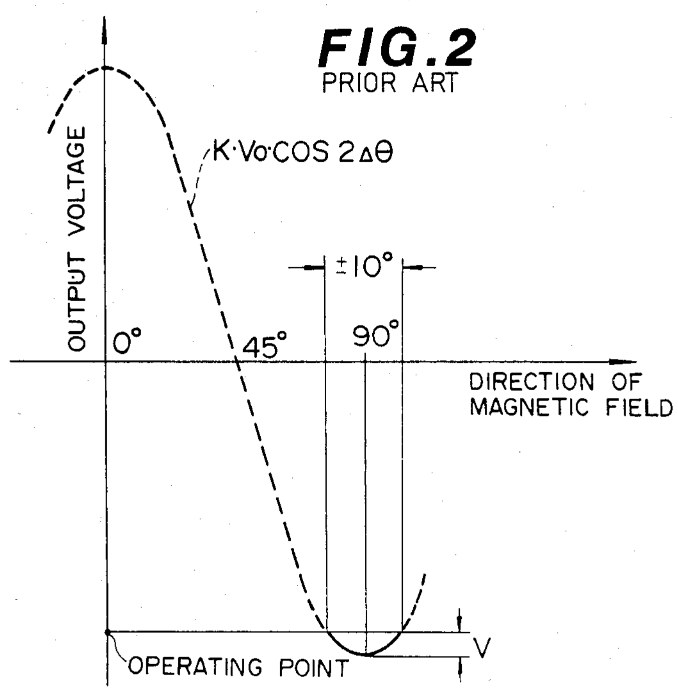
FIG. 2 is a graphical representation of the relationship between the output voltage produced by the embodiment shown in FIG. 1 in response to changes in the angle of the magnetic field which is supplied to the magnetic sensor.

A graphical representation of the manner in which the output signal produced by difference amplifier 15 varies as a function of the angle of the bias field through the magnetoresistive elements is illustrated in FIG. 2. The broken curve of FIG. 2 represents this relationship for all angles of the bias field from 0° to 90°. As mentioned above, it is assumed that, in the absence of permeable member 7, the bias field is supplied at an angle of 90°. Of course, as permeable member 7 approaches magnetic sensor 10, the angle of the bias field rotates by an amount which is determined by the proximity of member 7. Hence, the 90° bias field undergoes a deviation angle $\pm\Delta\theta$. As a result of this deviation angle, the output signal produced by difference amplifier 15 changes in a corresponding manner. The solid curve in FIG. 2, in the vicinity of the 90° angle, represents the change in the output signal $\Delta V$ when the angle of the bias field varies by the deviation angle $\Delta\theta=\pm10°$. It is seen that, when the angle at which the bias field is supplied is reduced from 90°, the output voltage produced by difference amplifier 15 reaches a predetermined level. That is, the output voltage is reduced by the amount $\Delta V$, as illustrated in FIG. 2. A threshold detector (not shown) may be provided to detect when the output signal produced by difference amplifier 15 reaches the voltage level identified as the "operating point", so as to trigger further apparatus. Hence, when member 7 has reached the proximity of magnetic sensor 10 such that the angle of the bias field rotates by an amount sufficient to reduce the output signal to the "operating point" level, the contactless switch operates.

It has been found that the magnetic sensor shown in FIG. 1, having the bias field supplied at an angle of 90° in the absence of magnetically permeable member 7, is temperature dependent. In particular, the output signal produced by difference amplifier 15 exhibits a change on the order of 100–200 mV/10° C. This interference in the output signal produced by the temperature dependency of magnetic sensor 10 will produce an erroneous output voltage which, in turn, will result in improper operation. That is, the contactless switch will operate even though permeable member 7 has not yet reached the point at which the bias field changes by the predetermined amount for which the magnetic sensor has been set to detect. Hence, the contactless switch arrangement may operate prematurely or belatedly because of this temperature dependency of the magnetic sensor. If the magnetic sensor is intended to sense when member 7 reaches a predetermined point, this temperature dependency will interfere therewith.

Another disadvantage of the embodiment shown in FIG. 1 is that, since the bias field is supplied (in the absence of permeable member 7) at an angle of 90°, a relatively large change in that angle results in a relatively small change in the output voltage, as clearly illustrated in FIG. 2. Stated otherwise, the magnetic sensor is not highly sensitive to changes in the bias field angle and, thus, the magnetic sensor is not highly sensitive to changes in the position of permeable member 7. Stated mathematically, in the embodiment of FIG. 1, the relationship $\Delta V/\Delta\theta$ is too low. In accordance with the present invention, discussed below, the expression $\Delta V/\Delta\theta$ is made desirably higher, thereby improving the detection sensitivity of the magnetic sensor; and, in addition, the output signal produced by the magnetic sensor is made less responsive to changes in temperature.

Figure 3:
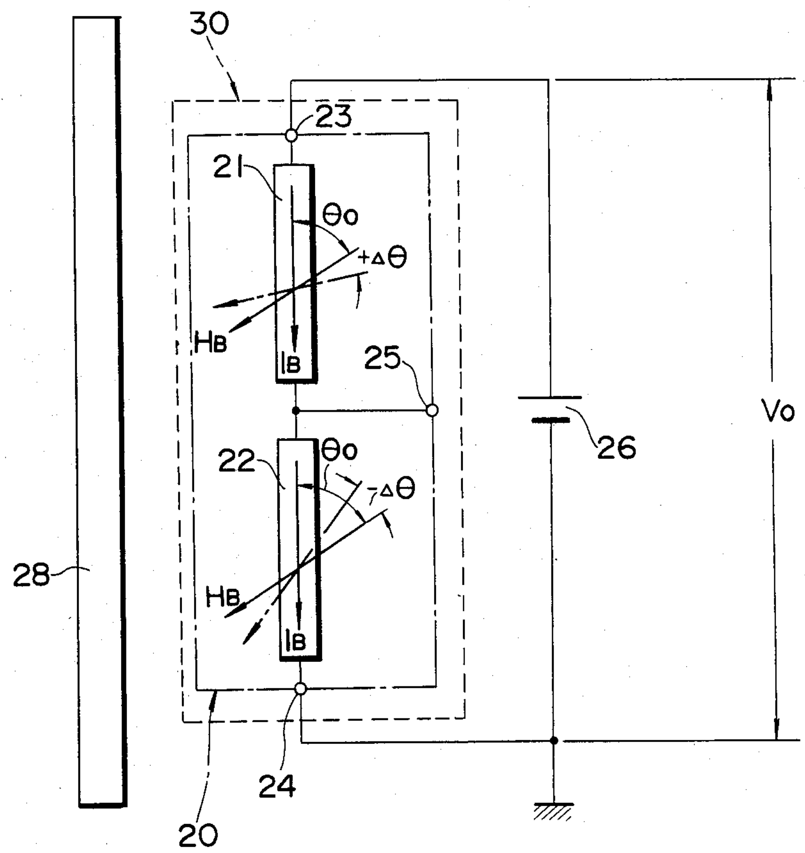
FIG. 3 is a schematic diagram of one embodiment of the present invention.

Reterring now to FIG. 3, there is schematically illustrated one embodiment of the present invention. In this embodiment, magnetoresistive elements 21 and 22 are schematically illustrated as having their respective current conducting paths aligned in the same direction. The magnetoresistive elements are connected in series, and terminals 23 and 24 are coupled to a power supply 26 such that current flows, in series, through the current conducting paths of elements 21 and 22. The junction defined by the series-connected magnetoresistive elements is coupled to an output terminal 25. Although not shown in FIG. 3, it should be appreciated that magnetoresistive elements 21 and 22 may be connected to additional resistors, such as resistors 11 and 12 of FIG. 1, to form a bridge arrangement, and the output of this bridge arrangement may be coupled to a difference amplifier, such as aforedescribed difference amplifier 15.

Magnetic sensor 20, which is formed of magnetoresistive elements 21 and 22, is supplied with a bias magnetic field $H_B$ parallel to the plane thereof, generated by a bias magnet 30 and sufficient to saturate the elements. As in the FIG. 1 embodiment, magnetic sensor 20 may be mounted on the bias magnet. However, in the embodiment of FIG. 3, the magnetoresistive elements are angularly positioned such that the main current conducting paths in each exhibit the same angle $\theta_o$ with respect to the direction of the bias fields $H_B$. For example, $\theta_o=45°$. It will be appreciated that, if desired, other angles $\theta_o$ may be used; and the current conducting paths of magnetoresistive elements 21 and 22 may not necessarily be aligned in parallel with each other.

A magnetically permeable member 28, which may be a magnetically permeable rod, is adapted to be moved relative to magnetic sensor 20 and proximate thereto, with its axis of movement disposed in a fixed plane. The proximity of member 28 to magnetic sensor 20 influences the direction at which the bias field $H_B$ is supplied to the magnetoresistive elements. Thus, the presence of member 28 results in an angular rotation of the bias field supplied to magnetoresistive element 21 by the deviation angle $+\Delta\theta$; and the presence of member 28 results in an angular rotation of the bias field supplied to magnetoresistive element 22 by the deviation angle $-\Delta\theta$. Of course, as a result of this change in the direction of the bias fields relative to the current conducting paths of magnetoresistive elements 21 and 22, the output signal derived from the magnetic sensor undergoes a corresponding change.

Let it be assumed that the resistance of magnetoresistive element 21 is represented as $R_A$. This resistance varies as a function of the deviation angle $\Delta\theta$ of the bias field in accordance with the following expression:

$$R_A(\Delta\theta)=R_{\perp}\sin^2(\theta_o+\Delta\theta)+R_{\parallel}\cos^2(\theta_O+\Delta\theta) \quad (3)$$

Equation (3) is seen to be equal to the Voight-Thomson equation (1), above. In a similar manner, if the resistance of magnetoresistive element 22 is represented as $R_B$, then this resistance also varies as a function of the deviation angle $\Delta\theta$ in accordance with the following equation:

$$R_B(\Delta\theta)=R_{\perp}\sin^2(\theta_o-\Delta\theta)+R_{\parallel}\cos^2(\theta_o-\Delta\theta) \quad (4)$$

It is recognized that magnetoresistive elements 21 and 22 function as a voltage divider. If the voltage supplied across these magnetoresistive elements by power supply 26 is equal to $V_o$, then the voltage produced at terminal 25 (relative to ground which is assumed to be supplied to terminal 24) may be derived as follows:

$$V(\Delta\theta) = \frac{R_B(\Delta\theta)}{R_A(\Delta\theta)+R_B(\Delta\theta)} V_o \quad (5)$$

$$= \frac{V_o}{2} - \frac{(R_{\perp}-R_{\parallel})\sin 2\Delta\theta}{2(R_{\perp}+R_{\parallel})} V_o \quad (6)$$

If magnetic sensor 20 is connected in a bridge arrangement similar to that shown in FIG. 1, and if this bridge is coupled to a difference amplifier, such as difference amplifier 15, then the output of the difference amplifier is a function only of the second term of equation (6), and this output signal may be represented as follows:

$$\Delta V=K_1V_0\cdot\sin 2\Delta\theta \quad (7)$$

Figure 4:
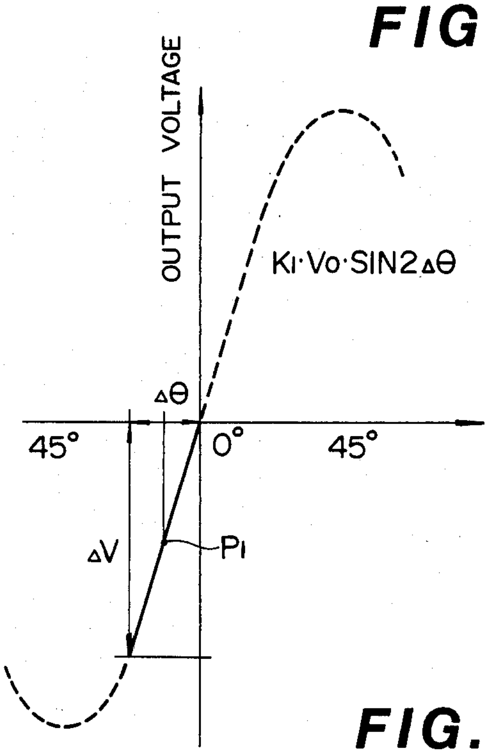
FIG. 4 is a graphical representation of the improved voltage/field-direction relationship attained by the present invention.

A graphical representation of equation (7), which illustrates the relationship between the output signal derived from magnetic sensor 20 and the angle at which the bias field is supplied thereto, is illustrated in FIG. 4. It will be seen that, when the deviation angle $\Delta\theta$ is zero ($\Delta\theta=0°$), the output signal $\Delta V$ also is equal to zero. Furthermore, the curve illustrated in FIG. 4 exhibits its maximum slope in the vicinity of $\Delta\theta=0°$, thereby representing that the output signal changes rapidly with the deviation angle $\Delta\theta$. Hence, the detection sensitivity of the embodiment shown in FIG. 3 is markedly improved over that which is attainable for the embodiment of FIG. 1. A small change in the deviation angle $\Delta\theta$ results in a relatively larger change in the output signal $\Delta V$. Furthermore, from the graphical representation shown in FIG. 4, it will be appreciated that the embodiment of FIG. 3 exhibits substantially zero temperature drift. That is, this embodiment possesses highly stable temperature characteristics.

For contactless switch applications, the operating point of the embodiment shown in FIG. 3 may be set at point $P_1$, illustrated on the curve in FIG. 4. Thus, when the deviation angle $\Delta\theta$ increases, due to the proximity of magnetically permeable member 28, the output signal $\Delta V$ derived from magnetic sensor 20 follows the solid portion of the curve in FIG. 4 until it reaches point $P_1$. At that point, the output signal $\Delta V$ is sufficient to trigger further apparatus. Hence, the embodiment shown in FIG. 3 operates as a contactless switch and is actuated when the permeable member reaches the position sufficient to rotate the bias fields $H_B$ by the deviation angle $\Delta\theta$ to produce the output signal corresponding to operating point $P_1$.

Figure 5:
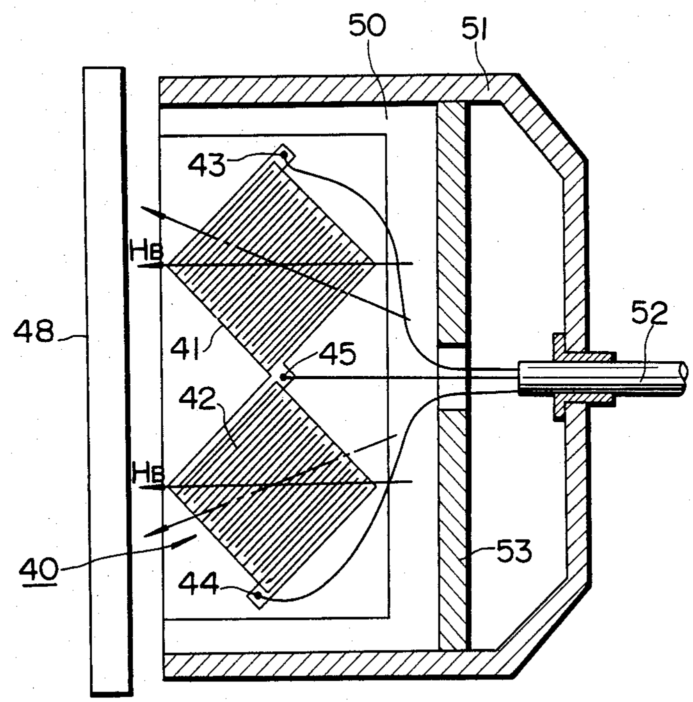
FIG. 5 is a schematic representation of a practical arrangement embodying the present invention.

A practical embodiment of the arrangement shown in FIG. 3 is illustrated in FIG. 5. In this practical embodiment, magnetoresistive elements 21 and 22 are illustrated as elements 41 and 42, these elements constituting magnetic sensor 40 which, in turn, is mounted on bias magnet 50. Elements 41 and 42 are particularly mounted such that the bias field $H_B$ is supplied at an angle of 45° (in the absence of magnetically permeable member 48) to the main current conducting paths in each element. The combination of magnetic sensor 40, mounted on bias magnet 50, is received in a housing 51; and electrical connections are made to terminals 43, 44 and 45 of magnetic sensor 40 through a cable 52 which passes through a suitable aperture in the housing. Preferably, housing 51 also is provided with a magnetic yoke 53 whose surface is substantially parallel to the longitudinal axis of magnetically permeable member 48. The use of yoke 53 serves to improve the sensitivity of the magnetic sensor to detect the approach of member 48. Preferably, magnetically permeable member 48 is a magnetically permeable rod. Furthermore, the axis of movement of rod 48 relative to magnetic sensor 40 is disposed within a fixed plane. This means that, when viewed in FIG. 5, rod 48 is constrained from moving in the horizontal or vertical direction, relative to the magnetic sensor, and is movable only in the direction which is normal to the plane of the drawings. Thus, rod 48 is movable in the fixed plane perpendicular to the plane of the drawings. This direction of movement is referred to as the "axis of movement".

In the embodiment shown in FIGS. 3 and 5, the angle at which the bias field $H_B$ is supplied to the magnetoresistive elements is equal to 45° ($\theta_o=45°$). As mentioned above, by supplying the bias field at this angle, in the absence of the magnetically permeable member, the sensitivity of the magnetic sensor is increased and, in addition, the temperature-dependency thereof is reduced. These advantageous effects can be obtained even if the direction of the bias field differs, by a small amount, from the preferred angle of 45°.

Figure 6:
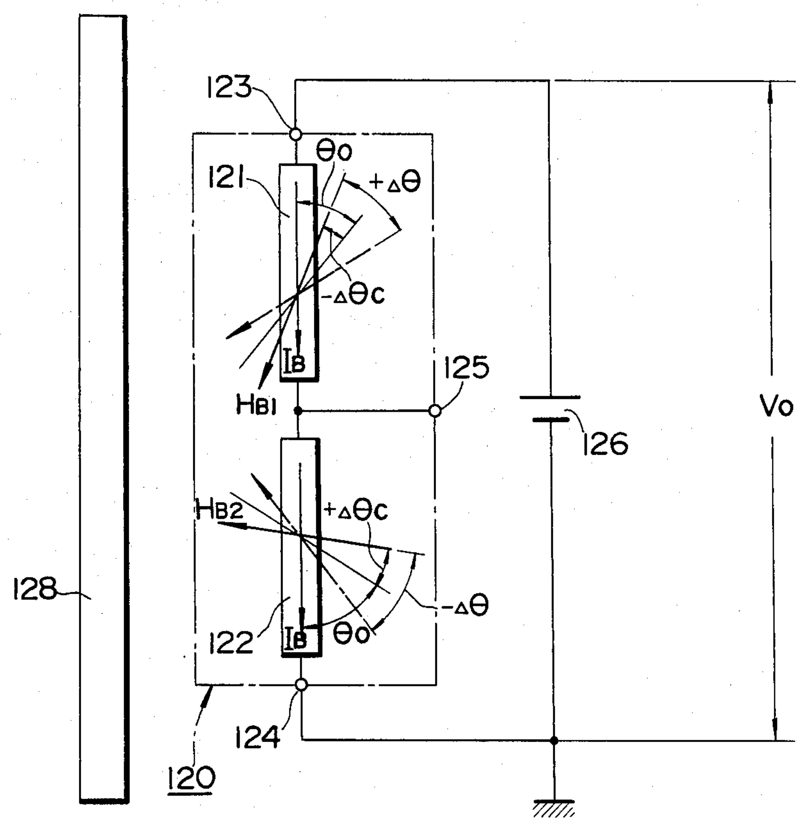
FIG. 6 is a schematic diagram of another embodiment of the present invention.

Another embodiment of the present invention is illustrated in FIG. 6. It is appreciated that the FIG. 6 embodiment is similar to that shown in FIG. 3, and in an effort to avoid confusion, the elements comprising the magnetic sensor are identified with the prefix numeral "1". Hence, as shown, magnetic sensor 120 is comprised of series-connected magnetoresistive elements 121 and 122, the junction defined by these series-connected elements being coupled to an output terminal 125. A power supply 26 is coupled across terminals 123 and 124 to supply d. c. current to the magnetic sensor.

Although not shown in FIG. 6, a bias magnet is provided to supply a bias magnetic field $H_{B1}$ to magnetoresistive element 21 and to supply a bias magnetic field $H_{B2}$ to magnetoresistive element 122. In the embodiment of FIG. 6, the main current conducting path of magnetoresistive element 121 is disposed at an angle $(\theta_o-\Delta\theta_C)$ with respect to the direction of bias field $H_{B1}$; and the main current conducting path of magnetoresistive element 22 is disposed at an angle $(\theta_o+\Delta\theta_C)$ with respect to the direction of the bias field $H_{B2}$. As will be described below, this may be achieved by mounting magnetoresistive element 121 on the bias magnet at one angle, and by mounting magnetoresistive element 122 on the bias magnet at a different angle. The angular amount $\pm\Delta\theta_C$ represents the different angles at which the respective magnetoresistive elements are mounted. These angles $\pm\Delta\theta_C$ are relatively small with respect to the angle $\theta_o$. Thus, the angle between bias field $HB_1$ and the current conducting path of magnetoresistive element 121 may be thought of as being slightly less than the angle $\theta_o$, and the angle between the bias field $H_{B2}$ and the current conducting path of magnetoresistive element 122 may be thought of as being slightly greater than the angle $\theta_o$.

As before, when magnetically permeable member 28 moves into proximity of magnetic sensor 120, the influence on the directions of the bias fields due to the presence of the magnetically permeable member results in the angular rotation of bias field $H_{B1}$ by the deviation angle $\pm\Delta\theta$, and the angular rotation of bias field $H_{B2}$ by the deviation angle $-\Delta\theta$. If it is assumed that angle $\theta_o$ is equal to 45° ($\theta_o=45°$), and if it is assumed that the resistances of magnetoresistive elements 121 and 122 may be represented as $R_A$ and $R_B$, respectively, then the resistances $R_A$ and $R_B$ are a function of the angle at which the bias fields are supplied to the respective magnetoresistive elements. These resistances may be determined by the Voight-Thomson equation as:

$$R_A(\Delta\theta)=R_\perp\sin^2[45°-(\Delta\theta_C-\Delta\theta)]+R_\parallel\cos^2[45°-(\Delta\theta_C-\Delta\theta)] \quad (8)$$

$$R_B(\Delta\theta)=R_\perp\sin^2[45°+(\Delta\theta_C-\Delta\theta)]+R_\parallel\cos^2[45°+(\Delta\theta_C-\Delta\theta)] \quad (9)$$

It is seen that equations (8) and (9) above are similar to aforedescribed equations (3) and (4).

Magnetoresistive elements 121 and 122 function as a voltage divider circuit. Hence, the signal produced at output terminal 25 is an output voltage $V(\Delta\theta)$ whose magnitude varies as a function of the angle at which the respective bias fields are supplied. This output voltage may be expressed as:

$$V(\Delta\theta) = \frac{R_B(\Delta\theta)}{R_A(\Delta\theta)+R_B(\Delta\theta)}\cdot V_o = \frac{V_o}{2} - \frac{(R_\perp - R_\parallel)\sin 2(\Delta\theta_C-\Delta\theta)}{2(R_\perp + R_\parallel)} V_o \quad (10)$$

It is appreciated that magnetic sensor 120 may be connected in a bridge configuration similar to that shown in FIG. 1. Hence, the first term of equation (10) may be cancelled. As a result, the output signal derived from magnetic sensor 120 is a function only of the right-most term in equation (10), such that the output signal $\Delta V$ derived from the magnetic sensor may be expressed as:

$$\Delta V=K_1 V_0\cdot\sin2(\Delta\theta_C-\Delta\theta) \quad (11)$$

Figure 7:
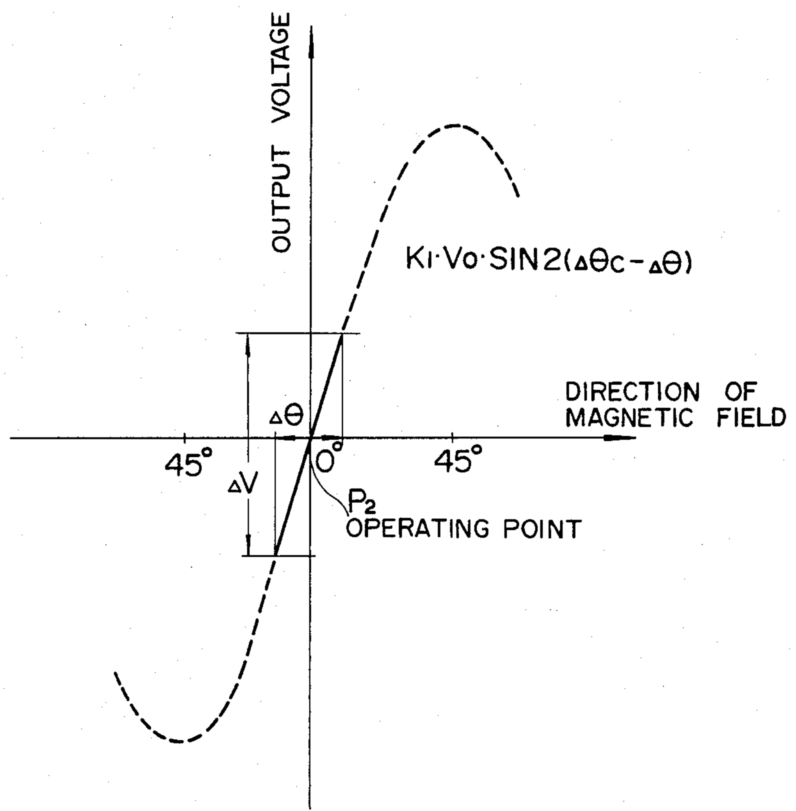
FIG. 7 is a graphical representation of the voltage/-field-direction relationship exhibited by the embodiment of FIG. 6.

A graphical representation of equation (11) is illustrated in FIG. 7. The maximum sensitivity for the embodiment of FIG. 6 may be determined by differentiating $\Delta V$ with respect to $\Delta\theta$. It is found, therefore, that the slope of the curve illustrated in FIG. 7 is a maximum when $\Delta\theta_C-\Delta\theta=0°$. Of course, as discussed above, $\Delta\theta_C\neq0$ Hence, the operating point $P_2$ may be selected as the origin (shown in FIG. 7), wherein $\Delta\theta_C-\Delta\theta=0$. In the absence of magnetically permeable member 28, the output voltage derived from the magnetic sensor will be located, for example, on the broken curve shown in FIG. 7. However, as the magnetically permeable member approaches the magnetic sensor, the output voltage changes along the solid portion of the illustrated curve; and when $\Delta\theta_C-\Delta\theta=0$, the output signal is reduced to zero volts. Operating point $P_2$ thus is reached; and the contactless switch arrangement may be thought of as being actuated.

Here too, as in the embodiment of FIG. 3, if $\theta_o=45°\pm\Delta\theta_C$, the output signal derived from magnetic sensor 120 exhibits highly stable temperature characteristics and, thus, is substantially temperature independent when the operating point $P_2$ is reached. This means that the sensitivity of the magnetic sensor is not deleteriously influenced by temperature changes; and the location of the magnetically permeable member at the predetermined point corresponding to operating point $P_2$ is detected accurately.

Figure 8:
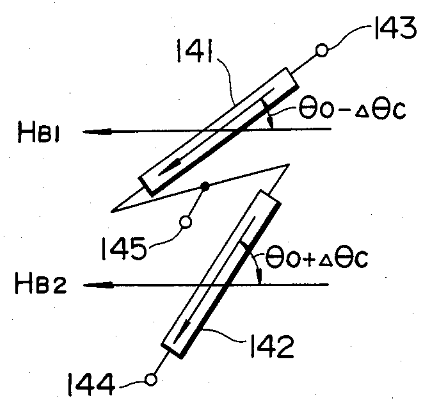
FIG. 8 is a schematic diagram of an embodiment by which the arrangement shown in FIG. 6 is attained.

FIG. 8 is a schematic illustration of the relative alignments of the main current conducting paths of magnetic sensor 120 to achieve the respective angles $(\theta_o-\Delta\theta_C)$ and $(\theta_o+\Delta\theta_C)$ between these main current conducting paths and bias fields $H_{B1}$ and $H_{B2}$, respectively. In particular, in FIG. 8, the bias magnet (not shown) supplies the bias fields $H_{B1}$ and $H_{B2}$ in the same direction. Magnetoresistive element 141, which corresponds to aforedescribed magnetoresistive element 121, is disposed such that the main current conducting path thereof exhibits the angle $(\theta_o-\Delta\theta_C)$ with respect to the direction of the bias field. Likewise, magnetoresistive element 142, which corresponds to aforedescribed magnetoresistive element 122, has its main current conducting path at an angle $(\theta_o+\Delta\theta_C)$ with respect to the bias field.

Figure 9:
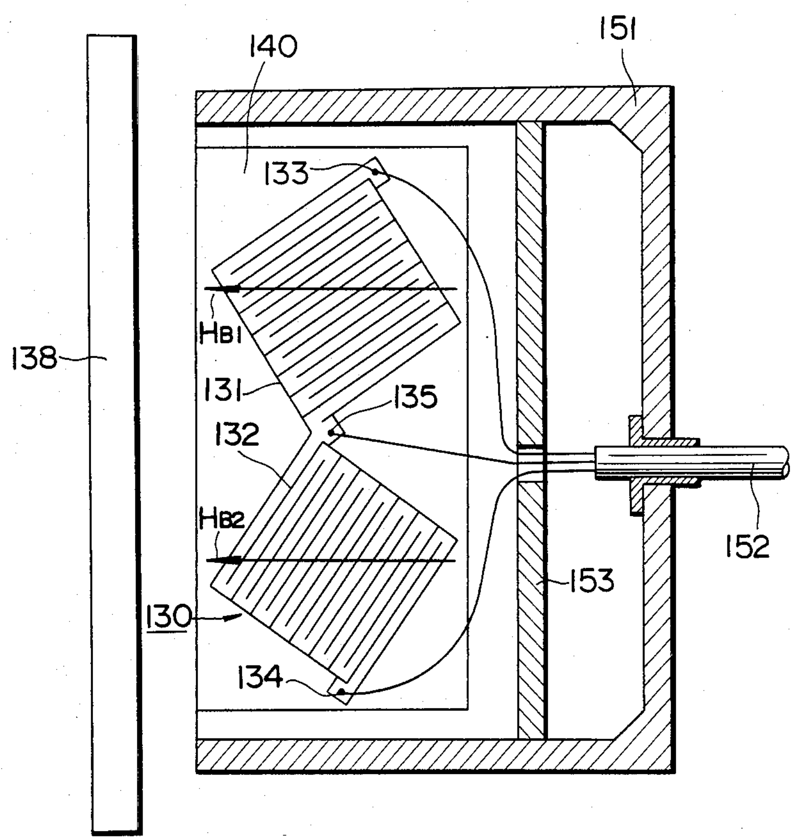
FIG. 9 a schematic representation of a practical arrangement embodying the invention shown in, for example, FIG. 8.

A practical embodiment of the arrangement shown in FIG. 6 is illustrated in FIG. 9. It will be appreciated that the embodiment of FIG. 9 is quite similar to that described hereinabove with respect to FIG. 5 and, in the interest of brevity, further description of FIG. 9 is not provided.

While the present invention has been particularly shown and described with reference to certain preferred embodiments thereof, it will be readily apparent to those of ordinary skill in the art that various changes and modifications in form and details may be made without departing from the spirit and scope of the invention. For example, in the foregoing, the angle $\theta_o$ at which the bias field is supplied to each of the magnetoresistive elements preferably has been equal to 45° ($\theta_o=45°$). At this angle, the temperature drift of the output signal $\Delta V$ due to changes in temperature is substantially equal to zero. Nevertheless, temperature drift in the output signal may be reduced, and the sensitivity of the magnetic sensor may be increased even if $\theta_o$ is not precisely equal to 45° such as described hereinabove with respect to the embodiment shown in FIGS. 6–9. It is intended that the appended claims be interpreted as including other changes and modifications.

What is claimed is:

1. A magnetic sensor for sensing the proximity of a magnetically permeable member, the sensor and member being relatively movable with respect to each other and having an axis of movement disposed within a fixed plane, said magnetic sensor comprising first and second coplanar magnetoresistive elements, each magnetoresistive element having a main current conducting path and processing anisotropic resistance as a function of the direction of a resultant magnetic field applied thereto, said two magnetoresistive elements being connected in series with each other to define a junction therebetween; means for supplying a d. c. current to said series-connected magnetoresistive elements; bias means for supplying first and second saturating bias magnetic fields to said first and second magnetoresistive elements, respectively, at the same angle $\theta_o$ only to each of the respective main current conducting paths thereof in the absence of said magnetically permeable member, with said first and second saturating bias magnetic fields being the only bias magnetic fields supplied to said first and second magnetoresistive elements, respectively, said angle $\theta_o$ differing substantially from 90° and 270°, said angle at which each bias field is supplied being changed by substantially equal and opposite small deviation angles $\pm\Delta\theta$ in response to the releative movement of said permeable member proximate said magnetic sensor; and output means coupled to said junction to produce an output signal which varies as a function of said deviation angles by which the angles of said bias fields change.

2. The sensor of claim 1 wherein the main current conducting paths of said two magnetoresistive elements are parallel to each other.

3. The sensor of claim 1 wherein said output signal is an output voltage $\Delta V$ which varies as a function of said deviation angles $\Delta\theta$ in accordance with the equation $\Delta V = K_1 V_o \sin 2\Delta\theta$, wherein $K_1$ is a constant and $V_o$ is the voltage produced across the series-connected magnetoresistive elements by said means for supplying a d. c. current thereto.

4. The sensor of claim 3 wherein said angle $\theta_o$ at which said first and secnd bias magnetic fields are supplied to said magnetoresistive elements is equal to 45° ($\theta_o = 45°$).

5. The sensor of claim 1 wherein said bias means is a bias magnet; and wherein the bias magnetic fields are parallel to said coplanar magnetoresistive elements.

6. A magnetic sensor for sensing the proximity of a magnetically permeable member, the sensor and member being relatively movable with respect to each other and having an axis of movement disposed within a fixed plane, said magnetic sensor comprising first and second coplanar magnetoresistive elements, each magnetoresistive element having a main current conducting path and processing anisotropic resistance as a function of the direction of a resultant magnetic field applied thereto, said two magnetoresistive elements being connected in series with each other to define a junction therebetween; means for supplying a d. c. current to said series-connected magnetoresistive elements; bias means for supplying first and second saturating bias magnetic fields to said first and second magnetoresistive elements only at angles $\theta_o + \Delta\theta_C$ and $\theta_o - \Delta\theta_C$, respectively, to the respective main current conducting paths thereof in the absence of said magnetically permeable member, $\Delta\theta_C$ being a relatively small angle with respect to the angle $\theta_o$ and said angle $\theta_o$ differing substantially from 90° and 270°, with said first and second saturating bias magnetic fields being the only bias magnetic fields supplied to said first and second magnetoresistive elements, respectively, said angle at which each bias field is supplied being changed by substantially equal and opposite small deviation angles $\pm\Delta\theta$ in response to the relative movement of said permeable member proximate said magnetic sensor; and output means coupled to said junction to produce an output signal which varies as a function of said deviation angles by which the angles of said bias fields change.

7. The sensor of claim 6 wherein the bias field supplied at the angle $\theta_o + \Delta\theta_C$ changes by the deviation angle $-\Delta\theta$ and the bias field supplied at the angle $\theta_o - \Delta\theta_C$ changes by the deviation angle $+\Delta\theta$ in response to said relative movement of said permeable member proximate said magnetic sensor.

8. The sensor of claim 6 wherein said bias means comprises a bias magnet for generating bias magnetic fields parallel to said coplanar magnetoresistive elements; and wherein said respective main current conducting paths are disposed at angles $\theta_o + \Delta\theta_C$ and $\theta_o - \Delta\theta_C$, respectively, with respect to the direction of said bias magnetic fields.

9. The sensor of claim 6 wherein $\theta_0 = 45°$.

10. The sensor of claim 6 wherein said output signal is an output voltage $\Delta V$ which varies as a function of said deviation angles $\Delta\theta$ in accordance with the equation $\Delta V = K_1 V_o \sin 2(\Delta\theta_C - \Delta\theta)$, wherein $K_1$ is a constant and $V_o$ is the voltage produced across the series-connected magnetoresistive elements by said means for supplying a d. c. current thereto.

11. The sensor of claim 1 or 6 wherein said magnetically permeable member is a magnetically permeable rod.

12. The sensor of claim 1 or 6 wherein said output means comprises a pair of series-connected resistors coupled in parallel with said series-connected magnetoresistive elements to form a bridge circuit; and a difference amplifier having a pair of inputs coupled to the junctions defined by said resistors and magnetoresistive elements, respectively.

* * * * *